US011825286B2

(12) United States Patent
Wickham et al.

(10) Patent No.: US 11,825,286 B2
(45) Date of Patent: Nov. 21, 2023

(54) NON-PLANAR POLYCRYSTALLINE DIAMOND BODY (71) Applicant: ELEMENT SIX TECHNOLOGIES LIMITED, Didcot (GB)

(72) Inventors: Benjamin Wickham, Didcot (GB); Ian Friel, Didcot (GB)

(73) Assignee: Element Six Technologies Limited, Didcot (GB)

( * ) Notice: Subject to any disclaimer, the term of this patent is extended or adjusted under 35 U.S.C. 154(b) by 123 days.

(21) Appl. No.: 17/764,742

(22) PCT Filed: Dec. 22, 2020

(86) PCT No.: PCT/EP2020/087601
§ 371 (c)(1),
(2) Date: Mar. 29, 2022

(87) PCT Pub. No.: WO2021/130212
PCT Pub. Date: Jul. 1, 2021

(65) Prior Publication Data
US 2022/0369038 A1 Nov. 17, 2022

(30) Foreign Application Priority Data
Dec. 23, 2019 (GB) .................................. 1919158

(51) Int. Cl.
C23C 16/27 (2006.01)
H04R 7/12 (2006.01)
(Continued)

(52) U.S. Cl.
CPC ............. H04R 7/127 (2013.01); C23C 16/01 (2013.01); C23C 16/271 (2013.01);
(Continued)

(58) Field of Classification Search
CPC ..... C23C 16/27; C23C 16/271; C23C 16/272; C23C 16/274
See application file for complete search history.

(56) References Cited

U.S. PATENT DOCUMENTS 5,241,140 A 8/1993 Itoh et al.
5,556,464 A 9/1996 Tanabe et al.
(Continued)

FOREIGN PATENT DOCUMENTS

EP 2856774 A2 4/2015
EP 2931935 A1 10/2015
(Continued)

OTHER PUBLICATIONS

United Kingdom Patent Application No. GB1919158.4, Combined Search and Examination Report dated May 28, 2020, 6 pages.
(Continued)

Primary Examiner — Elizabeth E Mulvaney
(74) Attorney, Agent, or Firm — Kilpatrick Townsend & Stockton LLP (57) ABSTRACT A non-planar chemical vapour deposition polycrystalline diamond body has a dome body having an apex and an outer periphery. The dome body has an average radius of curvature in a range of 4 mm to 25 mm and a maximum linear dimension at the outer periphery of the dome body of no more than 26 mm. The average radius of curvature is no less than 0.6 times the maximum linear dimension at the outer periphery. A method of fabricating the non-planar diamond body is also disclosed.

14 Claims, 3 Drawing Sheets (51) Int. Cl.
*C23C 16/01* (2006.01)
*H04R 31/00* (2006.01)

(52) U.S. Cl.
CPC .......... *C23C 16/272* (2013.01); *C23C 16/274* (2013.01); *H04R 31/003* (2013.01); *H04R 2207/021* (2013.01); *H04R 2307/023* (2013.01)

(56) References Cited

U.S. PATENT DOCUMENTS

| | | |
|---|---|---|
| 6,248,400 B1 | 6/2001 | Kurihara et al. |
| 2015/0110937 A1* | 4/2015 | Sako ................ A23L 7/196 426/508 |
| 2022/0225043 A1* | 7/2022 | Wickham ............... H04R 7/127 |
| 2022/0369038 A1* | 11/2022 | Wickham .............. C23C 16/458 |

FOREIGN PATENT DOCUMENTS

| | | |
|---|---|---|
| GB | 2429367 A | 2/2007 |
| WO | 2005101900 A1 | 10/2005 |
| WO | 2006075238 A2 | 7/2006 |
| WO | 2012110357 A1 | 8/2012 |
| WO | 2013178535 A2 | 12/2013 |
| WO | 2014090664 A1 | 6/2014 |

OTHER PUBLICATIONS

United Kingdom Patent Application No. GB2020335.2, Combined Search and Examination Report dated Apr. 20, 2021, 5 pages.
International Patent Application No. PCT/EP2020/087601, International Search Report and Written dated Apr. 6, 2021, 13 pages.

* cited by examiner

NON-PLANAR POLYCRYSTALLINE DIAMOND BODY

FIELD

The invention relates to the field of non-planar diamond bodies, and in particular, non-planar bodies made at least partially from polycrystalline diamond.

BACKGROUND

Diamonds have long been used in jewellery due to their long life and aesthetic appeal. Diamond materials also have a range of desirable properties for a large number of different technical applications. For example, the high thermal conductivity of diamond makes it suitable for heat spreading applications. The properties of diamond make it suitable for many optical applications. The hardness of diamond makes it good in abrasive applications. The stiffness of diamond makes it suitable for applications such as speaker domes. Such speaker domes can form high frequency tweeters with a very high break-up frequency beyond the human audio range in order to produce a very high quality sound in the human audio range. Non-planar diamond bodies can be used in applications including but not limited to speaker domes, microphone diaphragms and optical elements.

WO2005/101900 discloses such a diamond speaker dome. As described in WO2005/101900, harmonics can extend below the fundamental break-up frequency so it is desirable for the break-up frequency to be well above from the end of the human audio range to ensure that sound reproduction is not impaired by flexing of the speaker dome at high frequency oscillation. WO2005/101900 describes that a speaker dome having a high break-up frequency can be provided by a synthetic diamond speaker dome having an integral peripheral skirt of specific dimensions. No details of the specific manufacturing method for fabricating such a speaker dome are recited in the document.

In some applications, such as speakers for headphones, a separate tweeter is not used and a single diamond speaker must handle a much wider range of frequencies than a tweeter would be expected to handle; this includes frequencies in the bass, mid-range and high ranges.

GB2429367 discloses a diamond diaphragm that has variable thickness, hardness and damping characteristics in order to cover a wider range of frequencies. The diamond diaphragm described in GB2429367 is grown using a hot filament technique. The thickness at the apex of the diaphragm varies greatly from the thickness at the outer periphery of the diaphragm by over an order of magnitude (in a range of 3 μm to 50 μm), with the apex having a much greater thickness than the periphery.

A further problem with the variation on thickness is that it impacts the mechanical integrity of the diaphragm and makes it more difficult to handle. Such diaphragms can be of the order of tens of microns in thickness, so any thinner regions can be a significant area of weakness. Thickness variation can also make the diamond diaphragm more prone to cracking on release from a substrate after growth. At points where the diaphragm is at its thinnest, pinholes can occur in the diamond, and cracks that would otherwise not be too detrimental to the overall strength of the diamond can pass from one side of the diaphragm to the other through the thickness, significantly weakening the diaphragm.

SUMMARY

The variation in thickness described above has been found to reduce the breakup frequency of the diaphragm, which is deleterious to its performance. It is an object to provide a non-planar polycrystalline chemical vapour deposition (CVD) diamond body with a range of dimensions that allows an improved breakup frequency and also an improved variation of thickness to ensure better mechanical handling.

According to a first aspect, there is provided a non-planar CVD polycrystalline diamond body comprising a dome body having an apex and an outer periphery. The dome body has an average radius of curvature in a range of 4 mm to 25 mm, a maximum linear dimension at an outer periphery of the dome body of no more than 26 mm, wherein the average radius of curvature of no less than 0.6 times the maximum linear dimension at the outer periphery. These parameters have been found to give a reduced variation in thickness while maintaining an adequate breakup frequency. Note that for a dome body having a circular plan profile, the maximum linear dimension is the diameter.

As an option, the non-planar CVD polycrystalline diamond body has a segment angle $\varphi_0$ of no more than 82.5°.

The non-planar CVD polycrystalline diamond body optionally has a peripheral body extending at least partially around the outer periphery of the dome body. The dome body and the peripheral body are optionally integrally formed from polycrystalline diamond.

As an option, the dome body is a partial spherical surface. The dome body optionally comprises any of a partial ellipsoidal surface and a partial spherical surface.

Optional dimensions of the non-planar CVD polycrystalline diamond body are described in the appended claims.

According to a second aspect, there is provided a speaker dome comprising the non-planar CVD polycrystalline diamond body as described above in the first aspect. As an option, during use a break-up frequency of the speaker dome is selected from any of greater than 10 kHz, 20 kHz, 30 kHz, 40 kHz, 50 kHz, 60 kHz, 65 kHz and 70 kHz.

According to a second aspect, there is provided a method of fabricating the non-planar CVD polycrystalline diamond body described above in the first aspect. The method comprises providing a non-planar substrate, the substrate defining a dome body mould, the dome body mould having an average radius of curvature in a range of 4 mm to 25 mm, a maximum linear dimension at an outer periphery of the dome body of no more than 26 mm, wherein the average radius of curvature of no less than 0.6 times the maximum linear dimension at the outer periphery. A film of polycrystalline diamond is grown in a CVD reactor on the non-planar substrate to a mean dome body thickness in a range of 10 μm to 100 μm. The film of polycrystalline diamond is then removed from the substrate to form the non-planar body.

As an option, the substrate is formed of silicon, and the step of removing the film of polycrystalline diamond from the substrate comprises dissolving the silicon in acid. As an alternative option, the substrate is formed from graphite and the step of removing the film of polycrystalline diamond from the substrate comprises processing the graphite away from the polycrystalline diamond. As a further alternative option, the substrate is formed from a carbide forming refractory metal substrate and the step of removing the film of polycrystalline diamond from the substrate comprises cooling the carbide forming refractory metal substrate and the film of polycrystalline CVD synthetic diamond material at a controlled rate whereby the film of polycrystalline CVD synthetic diamond material delaminates from a metal carbide surface of the carbide forming refractory metal substrate during cooling. As a further option, the substrate is formed from silicon carbide or a silicon carbide/diamond structure. Interlayers may also optionally be used on the surface of the substrate.

The skilled person will appreciate that the reactor is selected from any suitable CVD reactor, examples of which include a microwave plasma CVD reactor, a hot filament reactor, and a DC arc jet reactor.

The non-planar substrate optionally comprises either a convex dome shape or a concave dome shape.

As an option, the method comprises providing a plurality of non-planar substrates and growing films of polycrystalline diamond on each of the plurality of non-planar substrates in the CVD reactor.

BRIEF DESCRIPTION OF DRAWINGS

Non-limiting embodiments will now be described by way of example and with reference to the accompanying drawings in which.

DETAILED DESCRIPTION

The polycrystalline chemical vapour deposition (CVD) synthetic diamond portions of the non-planar body described herein can be grown using a variety of methods including hot filament, microwave plasma, and DC arc jet reactors. Each of these methods has its virtues. DC arc jet deposition systems tend to have highly localized growth rates, but suffer from electrode/nozzle erosion, high gas consumption and relatively poor area coverage. Hot filament reactors can coat large areas and 3D shapes but with limited film thickness and with relatively poor quality of diamond. In contrast, microwave plasma CVD diamond has become established as the leading method for producing high quality, bulk diamond. Unfortunately, microwave plasma methods have only limited capabilities to coat non-planar substrates due to the interaction of the microwave electric field and the non-planar substrate. Coating of even simple 3D shapes such as tool inserts or loudspeaker domes is made difficult by the effects of electric field concentrations at external corners or conversely the weakness in electric fields at internal corners. This variation in the electric field adversely affects the uniformity of both quality and thickness of the diamond film. Materials that are thermally sensitive in terms of melting point or thermal shock are even more challenging to coat uniformly in a microwave plasma reactor.

In light of the above, one would expect that a microwave plasma process would not be suitable for implementing embodiments of the present invention. However, it has been found that careful control of microwave plasma CVD apparatus, careful processing of the substrate surface, and careful control of the growth and cooling cycle makes it possible to perform the present invention using a microwave plasma CVD process. Since such a process results in higher quality diamond material when compared with alternative growth methods, it can thus be advantageous to use a microwave plasma CVD reactor in order to fabricate high quality polycrystalline CVD synthetic diamond material. For example, the CVD reactor may be operated at a microwave frequency in a range 800 MHz to 1000 MHz with a pressure of at least 80 Torr, 100 Torr, 120 Torr, 140 Torr, 160 Torr, 180 Torr, 200 Torr, 230 Torr, 260 Torr, or 300 Torr, and/or a microwave power of at least 2 kW, 5 kW, 10 kW, 15 kW, 20 kW, 25 kW, or 30 kW. If high operating powers and pressures are utilized for CVD diamond growth, cooling after growth can be achieved by reduction of power and pressure within the CVD reactor to avoid thermally induced cracking of the polycrystalline CVD synthetic diamond non-planar body. For example, the controlled rate of cooling may comprise reducing the growth temperature down to at least 800° C., 750° C., 700° C., 650° C. or 600° C. or 550° in a controlled ramp down over a time period of at least 10 minutes, 15 minutes, or 20 minutes prior to extinguishing plasma in the CVD reactor.

The process gas may comprise one or more of: a carbon containing gas in a range 1 to 10%, 1 to 7%, 2 to 5%, 2 to 4%, or 2.5 to 3.5% of a total process gas flow rate; an inert gas, such as argon, in a range 0 to 10%, 0.5 to 7%, 0.5 to 5%, 0.5 to 3%, or 1.0 to 2.0% of a total process gas flow rate; and hydrogen in a range 85 to 98%, 90 to 98%, 93.0 to 97.5%, 94.0 to 96.5%, or 95.0% to 96% of a total process gas flow rate. The process gas is directed towards the substrate through one or more gas inlet nozzles within the CVD reactor.

In order to provide the non-planar shape of the body, diamond is deposited on a substrate that provides a predominantly dome-shaped growth surface (either convex or concave).

Figure 1:
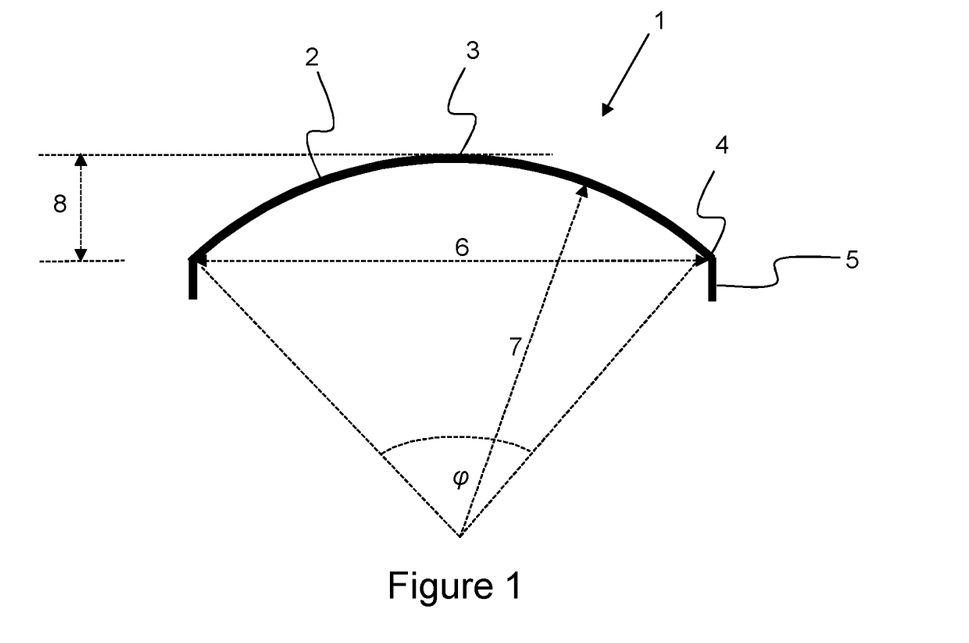
FIG. 1 illustrates a side elevation cross-section view of an exemplary non-planar CVD diamond body.

FIG. 1 illustrates schematically a side elevation view of an exemplary non-planar polycrystalline CVD diamond body 1. The body 1 comprises a dome body 2, which has an apex 3 and an outer periphery 4. A peripheral body 5 is optionally provided which extends from the outer periphery 4. The peripheral body can improve the overall stiffness of the body 1 and therefore improve the breakup frequency. In the example of FIG. 1, the peripheral body 5 is shown as a substantially cylindrical body extending from the outer periphery 4, but it may take a different shape.

The dome body 2 has a largest dimension 6 from the widest part of the outer periphery 4. The outer periphery is circular in plan view, and so the largest dimension 6 is a diameter. The dome body 2 also has a radius of curvature (RoC) 7 and a height 8, the height being the distance between a plane intersecting the apex 3 and a parallel plane intersecting the outer periphery 4. A segment angle $\varphi_0$ describes the angle between a first line joining a first point on the outer periphery 4 with the spherical centre of the dome body 2, and a second line joining a second point on the outer periphery 4 with the spherical centre of the dome body 2, the second point being located on the outer periphery 4 at a furthest distance from the first point. In the case of a partial ellipsoidal dome body 2, this refers to the largest segment angle and RoC.

Figure 2:
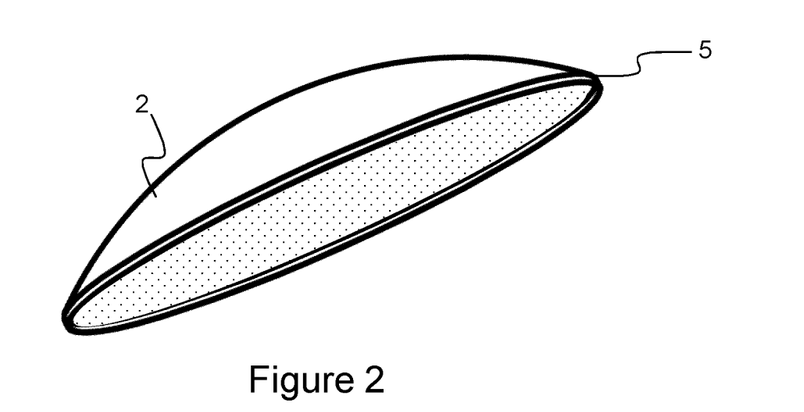
FIG. 2 is a perspective view of an exemplary non-planar CVD diamond body.

FIG. 2 herein is a perspective view of an exemplary non-planar polycrystalline CVD diamond body 1.

The break up frequency (or cut-off frequency) represents a boundary in a system's frequency response, beyond which input energy becomes attenuated. In terms of an acoustic break-up frequency of a dome body 2, in which the frequency is vibrational rather than electromagnetic, the break up frequency is the boundary in the system's frequency response, beyond which an acoustic actuator (such as a speaker dome or microphone membrane) can no longer reproduce the driven audio frequency with high-fidelity. In other words, above the break up frequency, distortion occurs and the accuracy of the reproduction of the driven audio frequency is reduced. A standing wave is established within the actuator and energy is lost to deformation of the speaker dome. This leads to a non-uniform speaker dome vibration and deformation at different points of the speaker dome, which gives variable amplitude vibration according to location across the surface of the speaker dome.

The break-up frequency of a speaker dome can be enhanced or increased by increasing the structural stiffness of the speaker dome. Stiffness can be increased by increasing the geometrical design and/or the material from which the speaker dome is made. Increased stiffness allows the speaker dome to resist deformation when driven to higher frequencies. Diamond is an ideal material choice because it is low density and has the highest Young's Modulus of any material. The high Young's modulus means that a diamond speaker dome is able to resist deformation, and the low density means that the diamond speaker dome is light, and therefore able to be responsive to movement.

The inventors have been considering changes to geometries of speaker domes and how these will affect the break up frequency of a speaker dome. In simple terms, a speaker dome can be considered as a thin, spherical shell of revolution: a three-dimensional body bound by two curved surfaces. The natural frequency (eigenfrequency) is the lowest frequency at which any system tends to oscillate in the absence of a damping or driving force. Conversely, the break-up frequency is a phenomenon resulting from driven oscillation, but the natural frequency and the break up frequency are directly comparable and both represent the same lowest energy vibrational modes. It should be noted that break-up frequency is a property of an assembly of which the primary object is a simply supported dome, whereas natural frequency can be calculated for unsupported or supported structures.

Natural frequencies can be modelled as follows:
E=Young's Modulus
$\rho^*$=specific density
h=thickness of shell
i,j=integer indices, i, j=0, 1, 2 . . .
$\vartheta$=Poisson's Ratio
R=radius of sphere or spherical segment
$\Omega^2$=frequency parameter
$s_{1, 2}$=structure factor, determined by the extent of the parent sphere described by the spherical shell
$\omega$=natural frequency of the thin spherical shell; and
$\varphi_0$=the described angle of the dome as a segment of a sphere $$\omega^2 = \frac{E \cdot \Omega^2}{\rho^* \cdot (1-\vartheta^2) \cdot R^2} \quad \text{(Eq 1)}$$

$$\Omega^2 = \frac{(i^2-1)^2 \cdot i^2 \cdot (1-\vartheta^2)}{3 \cdot (1+\vartheta)} \left(\frac{h}{R}\right)^2 \frac{s_1(i, \varphi_0)}{s_2(i, \varphi_0)} \quad \text{(Eq 2)}$$

$$\begin{cases} s_1(i, \varphi_0) = \frac{1}{8}\left[\frac{[\tan(\varphi_0/2)]^{2i-2}}{n-1} + \frac{2 \cdot [\tan(\varphi_0/2)]^{2i}}{n} + \frac{[\tan(\varphi_0/2)]^{2i+2}}{n+1}\right] \\ s_2(i, \varphi_0) = \int_0^{\varphi_0} \left(\tan\frac{\varphi_0}{2}\right)^{2i} [(i+\cos\varphi)^2 + 2(\sin\varphi)^2]\sin\varphi \cdot d\varphi \end{cases} \quad \text{(Eq 3)}$$

Equations 1 to 3 describe the natural frequency of a spherical shell as being proportional to the square root of Young's Modulus, inversely proportional to the square root of specific density and inversely proportional to the RoC both in the initial expression for natural frequency and again in the expression for frequency parameter. There is no further RoC dependence described in the structure factor terms.

The structure factor, $s_1$ and $s_2$ are geometrical terms, which contribute to the Frequency parameter, $\Omega$. It is independent of RoC, but describes the extent of any sphere that the dome/spherical shell defines. As $\varphi_0$ tends to zero, (i.e. the proportion of the described sphere decreases), $s_1$ increases and $s_2$ decreases; $s_1$ is inversely proportional to $\varphi_0^2$ and $s_2$ is proportional to $\varphi_0$. When combined, the structure factor term $s_1/s_2$ (and therefore $\Omega_2$) is inversely proportional to $\varphi_0^3$.

In other words, decreasing $\varphi_0$ on any RoC-dome design decreases the diameter of the spherical shell and the decreasing dome size necessitates a smaller wavelength (increased frequency) to set up the standing wave representative of the natural frequency vibrational mode. A smaller RoC is therefore expected to result in an increased break up frequency.

Figure 3:
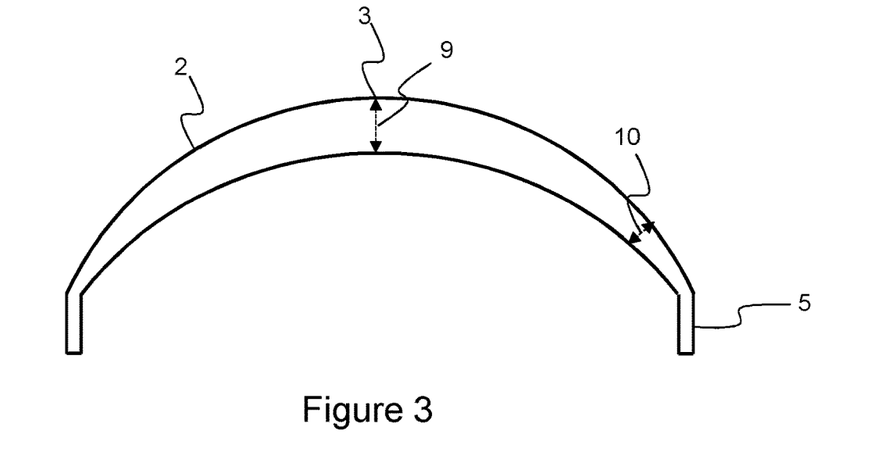
FIG. 3 illustrates a side elevation cross-section view of a portion of a dome body of an exemplary non-planar CVD diamond body.

As described above, the thickness of the non-planar polycrystalline CVD diamond body 1 varies at different points. FIG. 3 illustrates schematically a side elevation cross-section view of a portion of a dome body 2 of an exemplary non-planar body 1. The thickness 9 at the apex 3 is much greater than the thickness 10 at a portion of the dome body 2 further away from the apex 3. The thickness is typically at its lowest value at the outer periphery 4 of the dome body 2. As described above, this is deleterious to the breakup frequency of a speaker dome made from the non-planar polycrystalline CVD diamond body 1, and makes it more difficult to handle the diaphragm owing to increased cracking, pinholes, and weakness of the diamond.

This variation in thickness may be normalised by dividing the variation in thickness $\Delta d$ by the average thickness $<d>$ of the dome body 2.

The variation in thickness arises during the growth process because the apex 4 of the dome 2 is closer to the plasma than the outer periphery 4 of the dome 2. The combination of a shorter distance between the growth surface and the plasma, and a higher temperature means that carbon from the plasma preferentially deposits at the apex 2 instead of the outer periphery 4. This means that the height 8 of the dome body 2 has an effect on the variation in thickness; a greater height 8 will lead to a larger thickness variation between the apex 3 and the outer periphery 4. For a given RoC, the height 8 is proportional to the segment angle $\varphi_0$. It is therefore apparent that the variation in thickness is also dependent upon the segment angle $\varphi_0$. The lower the segment angle $\varphi_0$, the lower the height 8 and so the lower the thickness variation.

However, reducing the RoC for a given segment diameter 6 increases the height 8 of the dome body 2, and so a reduced RoC, while leading to an improved breakup frequency, also leads to a larger thickness variation. This larger thickness variation reduces the breakup frequency. If a constraint of the dome is that it must have a fixed diameter (for example, to fit with other components) then reducing the RoC would therefore be undesirable. However, note that reducing the RoC while maintaining a constant segment angle $\varphi_0$ will lead to a smaller height 8, and so improve the thickness variation.

Similarly, if the RoC is increased and the segment angle $\varphi_0$ is decreased, this can also increase the thickness variation depending on the degree of change of these parameters. Again, the increased thickness variation is deleterious to the breakup frequency.

The factors affecting the breakup frequency are summarised in Table 1 below:

TABLE 1

Summary of factors affecting breakup frequency (BuF)

| Factor | Effect on break-up frequency | Effect on thickness variation |
|---|---|---|
| Radius of Curvature | Decreasing RoC increases BuF | Decreasing RoC decreases thickness variation for a constant segment angle |
| Segment angle | Decreasing $\varphi_0$ increases BuF | Decreasing $\varphi_0$ decreases thickness variation for a constant RoC |
| Thickness variation | Reducing thickness variation from the apex to the periphery increases BuF | |

The inventors have realised that the various parameters affecting breakup frequency can have conflicting effects. Attempting to improve the breakup frequency by adjusting one parameter can have a deleterious effect on another parameter, which in turn has a deleterious effect on the breakup frequency.

For example, if the RoC of a dome body 2 is decreased while the segment angle $\varphi_0$ is increased, this can have a deleterious effect on the breakup frequency. While the reduced RoC on its own would lead to an increase in breakup frequency, the increased segment angle $\varphi_0$ would lead to an increase in thickness variation, which in turn would decrease the breakup frequency and weaken the dome body 2.

Similarly, if the segment angle $\varphi_0$ is decreased but the RoC is increased, the reduced segment angle $\varphi_0$ will reduce the thickness variation, which in turn would increase the breakup frequency. However, the increasing RoC would decrease the breakup frequency and weaken the dome body 2.

The effect of thickness variation has not previously been appreciated in the context of the other parameters. Despite conflicting effects of changing parameters, the inventors have found segment angle $\varphi_0$ and RoC parameters that maximise breakup frequency while still reducing the thickness variation.

The dome body 2 typically has a radius of curvature in a range of 4 mm to 25 mm, 6 mm to 23 mm, 8 mm to 20 mm, or 10 mm to 15 mm.

The dome body 2 typically has a segment angle $\varphi_0$ of no more than 82.5°, no more than 80° no more than 70° and no less than 40°.

The dome body 2 typically has an outer periphery maximum dimension (as previously noted, this is a diameter for a spherical dome body) in a range of 5 mm to 26 mm, 6 mm to 20 mm, and 8 mm to 15 mm.

The dome body 2 typically has a mean dome body thickness in a range of 10 µm to 100 µm, 20 to 80 µm, 30 to 60 µm or 40 to 50 µm The dome body 2 typically has a mean dome body thickness coefficient of variation of no more than 0.10, no more than 0.08, no more than 0.07 and no more than 0.05.

The dome body 2 typically has a mean thickness selected from any of no more than 500 µm, no more than 400 µm, no more than 300 µm, no more than 200 µm, no more than 100 µm, no more than 75 µm, and no more than 50 µm.

The dome body 2 typically has a height, defined as a distance between a first plane intersected by the apex and a second parallel plane intersected by the outer periphery, selected from any of 1 to 6 mm, 2 to 5 mm and 2.5 to 4 mm.

The non-planar body typically has a mass in a range selected from any of 15 mg to 150 mg, 40 mg to 120 mg, and 60 mg to 110 mg.

Figure 4A:
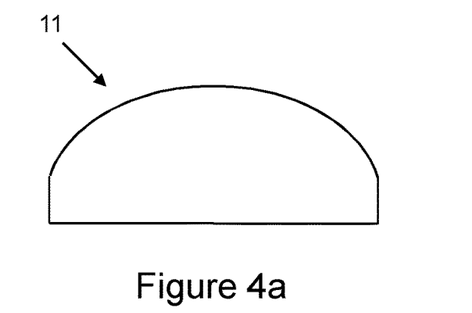
FIGS. 4a and 4b illustrate a side elevation cross-section view of alternative substrate designs on which to grow a non-planar CVD diamond body.
Figure 4B:
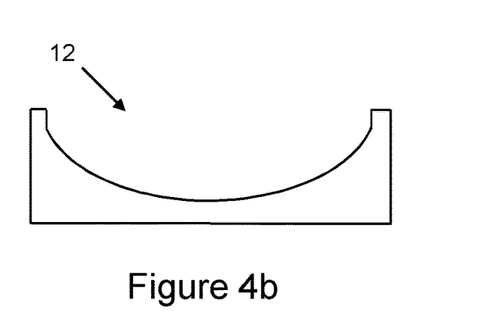

A substrate on which a non-planar polycrystalline CVD diamond body 1 is schematically illustrated in FIG. 4*a*. It should be noted that the higher thickness at the apex 3 than the outer periphery 4 can be reversed by growing on an inverted substrate, such as that illustrated schematically in FIG. 4*b*. In this case, during growth the apex 4 is furthest away from the plasma. However, this does not reduce $\Delta d/\langle d \rangle$ and it is more difficult to release the non-planar polycrystalline CVD diamond body 1 from the substrate after growth. This is because release is primarily effected by a mismatch in thermal expansion coefficient between the non-planar polycrystalline CVD diamond body 1 and the diamond body; in the example of FIG. 4*a*, the substrate contracts more than the non-planar polycrystalline CVD diamond body 1, allowing easy release. In the example of FIG. 4*b* the substrate contracts more than the non-planar polycrystalline CVD diamond body 1 putting the CVD diamond body into compression.

When selecting a substrate design, the skilled person must consider factors such as how easily the non-planar body will release from the substrate after growth and how evenly diamond will be deposited over the surface of the substrate. The skilled person is also aware that the average grain size of the diamond at the nucleation face (i.e. where diamond growth starts on the substrate) is typically larger than the average grain size of the diamond at the opposite face. As this can affect the properties of the resultant non-planar body, the skilled person may consider this factor when selecting a substrate design.

The skilled person must also select a suitable substrate material. Materials such as carbide-forming refractory metals, silicon, graphite, polycrystalline diamond, silicon carbide and silicon carbide/diamond composites may be used. U.S. Pat. No. 5,556,464 describes forming speaker domes by chemical vapour deposition of synthetic diamond material on a convexly curved substrate to form a synthetic diamond film thereon followed by separation of the synthetic diamond film from the substrate to yield a diamond speaker dome. Synthetic diamond material is deposited on a convexly curved silicon substrate and separation of the synthetic diamond film from the substrate to yield the diamond speaker dome is achieved by dissolving the silicon substrate in acid.

An alternative approach is to use a refractory carbide-forming metal as the substrate, as described in WO2013/178535. In this case, careful control of the surface roughness of a substrate is described. Polycrystalline CVD diamond is deposited onto the substrate and the mismatch of thermal expansion coefficients between the diamond and the substrate allows the controlled release of the diamond from the substrate on cooling. This type of process is also suitable for forming the non-planar bodies described herein, but it will be appreciated that complicated form-factors shapes may lead to keying of the diamond on the substrate and increase the risk of cracking on release of the diamond from the substrate.

The examples above describe a non-planar body formed entirely from polycrystalline diamond. However, it is possible for only the dome body 2 to be formed of polycrystalline diamond, and for the peripheral body 5 to be formed from a different material. Typical values of Young's modulus and density for polycrystalline diamond and other materials with a high Young's modulus are shown in Table 2 below. It can be seen that polycrystalline diamond has a significantly higher Young's modulus and comparable density to the other materials and is therefore provides a stiffer speaker dome with a higher break-up frequency than speaker domes made from other materials.

TABLE 2

Selected properties of materials:

| Material | Young's Modulus GPa | Density g/cm$^3$ |
| --- | --- | --- |
| Mg | 45 | 1.74 |
| Al | 70 | 2.70 |
| Au | 79 | 19.3 |
| Be | 287 | 1.85 |
| Sapphire | 345 | 3.98 |
| Polycrystalline diamond | 1143 | 3.51 |

In order to provide another material that has a high Young's modulus, the peripheral body 5 may be formed from the materials of Table 2 or from a densified or partially densified metal or metal alloy composite embedded with ultra-hard particles or grit. In this case, the ultra-hard particles or grit may be diamond or cubic boron nitride. The peripheral body 5 and the dome body 2 may be joined together using any suitable technique, such as use of an adhesive or brazing.

Note also that it may be advantageous to provide a coating on the non-planar body, such as those described in WO2012/110357.

Example

A series of non-planar polycrystalline diamond bodies were manufactured using a microwave plasma CVD technique. A first set of dome bodies were grown to a nominal thickness of 50 μm with a radius of curvature of 28 mm and a segment angle $\varphi_0$ of 88.8°. A second set of dome bodies were grown to a nominal thickness of 50 μm with a radius of curvature of 20 mm and a segment angle $\varphi_0$ of 82.0°.

Figure 5:
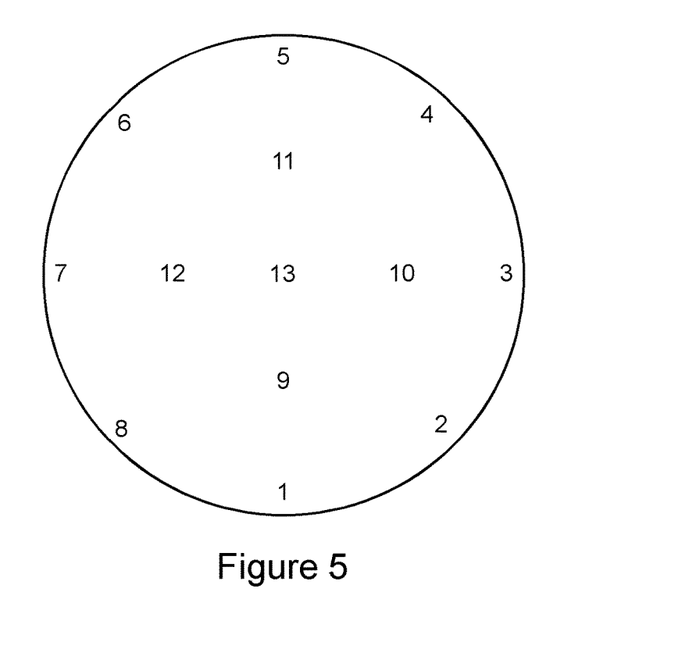
FIG. 5 illustrates schematically in plan view the points at which thickness of a dome body were measured.

The thickness of each of the dome bodies was measured by hand using a point micrometer at the points shown in the plan view of FIG. 5. For each dome body, a thickness coefficient of variation was determined based on the measurements taken at the points shown in FIG. 5. The coefficient of variation is a way of measuring the uniformity of the thickness of the dome body and is given by the following equation:

$$c_v = \frac{\sigma}{\mu} \qquad \text{(Eq 4)}$$

Where $c_v$ is the coefficient of variation, $\sigma$ is the standard deviation and $\mu$ is the mean value of thickness.

The thickness coefficient of variation for each dome body is calculated using a thickness measurement at the apex 3, eight thickness measurements around the periphery 4 and four thickness measurements at points roughly mid-way between the periphery 4 and the apex 3, as illustrated in FIG. 5. Note that while thirteen thickness data points per dome were measured and used to calculate the thickness coefficient of variation, the skilled person would appreciate that more or fewer data points could be taken.

Two runs of the first set of domes were prepared, and four runs of the second set of domes were prepared, with multiple dome bodies placed in a reactor for each growth run. The first set of dome bodies was grown in run 1 and 2, and the second set of dome bodies was grown in runs 3 to 6. A random selection of samples were taken from each run and the thickness coefficient of variation was calculated as described above. The coefficients of variation of runs 1 to 6 are shown in Table 3:

TABLE 3

Coefficients of variation from measured domes

| 1 | 2 | 3 | 4 | 5 | 6 |
| --- | --- | --- | --- | --- | --- |
| 0.115 | 0.110 | 0.049 | 0.053 | 0.067 | 0.051 |
| 0.108 | 0.118 | 0.059 | 0.055 | 0.045 | 0.068 |
| 0.127 | 0.123 | 0.049 | 0.070 | 0.061 | 0.062 |
| 0.130 | 0.113 | 0.054 | 0.054 | 0.048 | 0.060 |
| 0.127 | 0.119 | 0.046 | 0.046 | 0.049 | 0.063 |
| 0.119 | 0.116 | 0.066 | 0.064 | 0.065 | 0.043 |

It can be seen that for the first two sets of domes, the coefficient of variation of the thickness was consistently greater than 0.10, showing a variation in thickness across the dome body. For the second set of domes, the coefficient of variation of the thickness was consistently below 0.10, showing a lower variation in thickness across the dome body.

Figure 6:
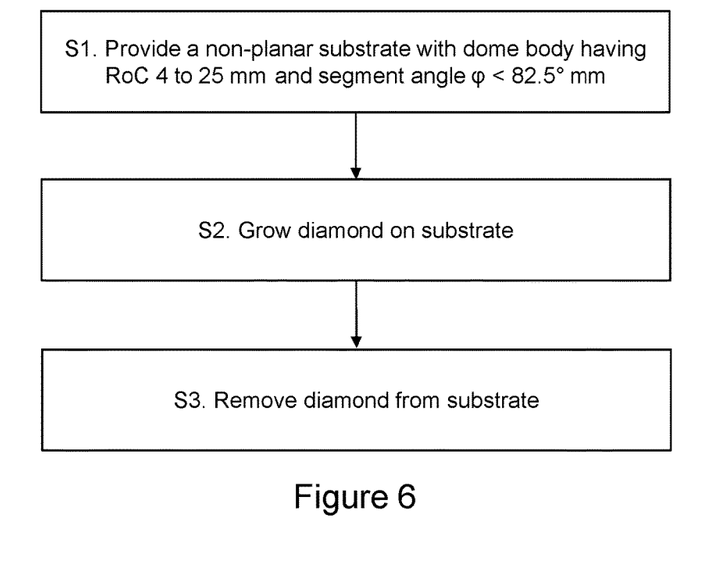
FIG. 6 is a flow diagram showing exemplary steps for making a polycrystalline CVD diamond non-planar dome body.

Turning now to FIG. 6, there is shown a flow chart showing exemplary steps in making a non-planar body as described above. The following numbering corresponds to that shown in FIG. 6:

S1. A non-planar substrate is provided. Any suitable substrate may be used. For example, it is known to grow diamond on a silicon substrate, on a graphite substrate, on a silicon carbide body, or on a carbide forming refractory metal substrate, such as tungsten, molybdenum, niobium, tantalum, titanium and alloys thereof. Note that the non-planar substrate may be used to form a substrate for the entire non-planar body, in which the dome body and the peripheral body are integrally formed, or may be used to form only the dome body. The substrate may include a convex or a concave dome body mould on which to grow diamond. The non-planar substrate dome body mould has a radius of curvature in a range of 4 mm to 25 mm and a segment angle $\varphi_0$ of no more than 82.5°.

S2. The substrate is placed in a reactor and a film of CVD polycrystalline diamond is grown on the substrate to a mean dome body thickness in a range of 10 μm to 100 μm. Suitable reactors include a microwave plasma CVD reactor, a hot filament reactor, and a DC arc jet reactor.

S3. Once diamond has been grown to the required thickness, the CVD polycrystalline diamond is removed from the substrate. Where the substrate is formed from silicon, the step of removing the film of polycrystalline diamond from the substrate may include dissolving the silicon in acid. Where the substrate is formed from graphite, the step of removing the film of polycrystalline diamond from the substrate may include processing the graphite away from the CVD polycrystalline diamond. Where the substrate is formed from a carbide forming refractory metal substrate, the step of removing the film of polycrystalline diamond from the substrate may include cooling the carbide forming refractory metal substrate and the film of polycrystalline CVD synthetic diamond material at a controlled rate whereby the film of polycrystalline CVD synthetic diamond material delaminates from a metal carbide surface of the carbide forming refractory metal substrate during cooling owing to a mismatch in thermal expansion coefficients.

Where the non-planar CVD polycrystalline diamond body 1 does not include an integral peripheral body 5, the method may also comprise affixing a peripheral body 5 to the outer periphery of the dome body 2 to form the non-planar CVD polycrystalline diamond body 1. For example, when the dome body 2 is grown in the reactor, the method further includes affixing the peripheral body 5 to the dome body 2 to form the non-planar body 1.

Figure 7:
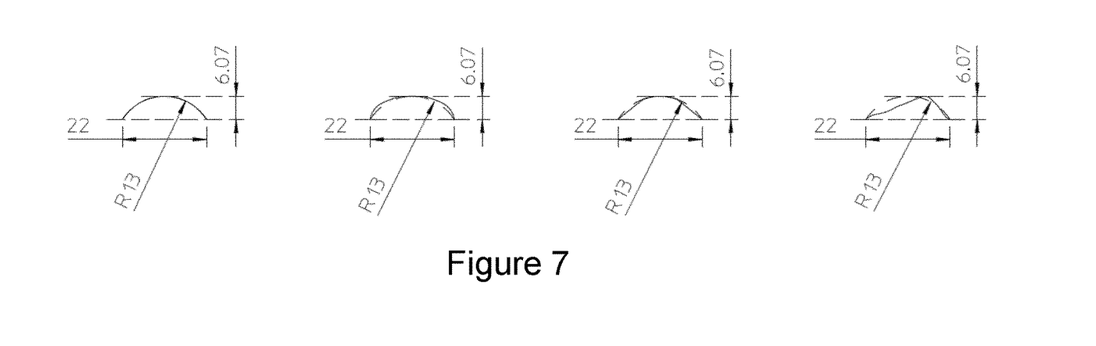
FIG. 7 illustrates in cross section various average radii of curvature.

The term 'average radius of curvature' is used herein to describe an aspect of the geometry of the non-planar body. For example, while the non-planar dome body may have a partial spherical surface with a radius of curvature, it may alternatively take other shapes, such as partial ellipsoidal. To illustrate how an average radius of curvature is found, four examples of different geometries are provide in FIG. 7.

In each example, the average radius of curvature is determined as follows: The radius of the arc subtended by three points describes the properties of the dome profile. Two of these points are located on the dome edge, located on the plane of the dome diameter. The third point to give the average radius of curvature is located on the plane determined by the 'tallest' part of the dome geometry; in other words, the point on a plane furthest away from the plane that is intersected by the dome edge profile, on which the other two points are located. The third point is minimally equidistant between the other two points. In all four examples of FIG. 7, the highest point of the profile above the plane interested by the outer diameter forms the nominal highest point for the average radius of curvature.

FIG. 7a illustrates an example in which the average radius of curvature is the radius of curvature.

FIG. 7b illustrates an example where the non-planar body has a 'flattened' profile.

FIG. 7c illustrates an example where the non-planar body has a substantially conical profile.

FIG. 7d illustrates an example where the apex of the dome is not, when looked at in plan view, at the centre of the circle defined by the diameter.

Figure 8:
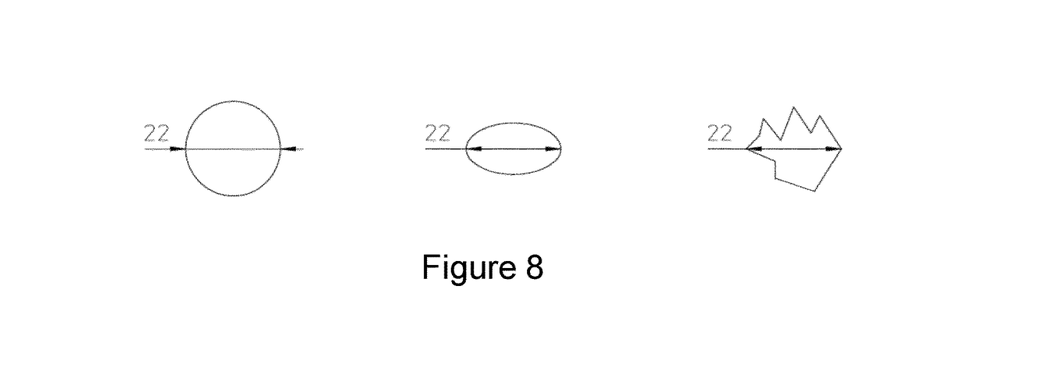
FIG. 8 illustrates in cross section various average diameters.

The term 'maximum linear dimension at the outer periphery is used herein to describe another aspect of the geometry of the non-planar body. In most cases the body will have a circular profile at the outer periphery of the non-planar body, and the maximum linear dimension at the outer periphery is the same as the diameter of the non-planar body. This example is illustrated in FIG. 8a. However, there may be other profiles at the outer periphery. For example, the non-planar body may define an elliptical shape having a major and a minor diameter. In this case, the maximum linear dimension at the outer periphery is defined as the line described by the points at the outer periphery of the non-planar body with the greatest linear separation. In the example of FIG. 8b, the greatest linear separation is shown as 25.76 mm, and so this is given as the maximum linear dimension at the outer periphery. Similarly, 8c shows an extreme example where the non-planar body defines a polygonal shape. Again, the maximum linear dimension at the outer periphery is defined as the line described by the points around the non-planar body with the greatest linear separation. This case is shown in FIG. 8c.

While this invention has been particularly shown and described with reference to preferred embodiments, it will be understood to those skilled in the art that various changes in form and detail may be made without departing from the scope of the invention as defined by the appendant claims. For example, the exemplary embodiments described above are manufactured using a microwave plasma CVD reactor, but the skilled person will appreciate that non-planar body can be manufactured using a variety of techniques, including growth in hot filament and DC arc jet reactors.

The invention claimed is:

1. A non-planar chemical vapour deposition, CVD, polycrystalline diamond body comprising:
    a dome body having an apex and an outer periphery;
    the dome body having an average radius of curvature in a range of 4 mm to 25 mm;
    a maximum linear dimension at the outer periphery of the dome body of no more than 26 mm;
    an average radius of curvature of no less than 0.6 times the maximum linear dimension at the outer periphery; and
    wherein the dome body thickness has a coefficient of variation of no more than 0.10.

2. The non-planar CVD polycrystalline diamond body according to claim 1, further comprising a peripheral body extending at least partially around the outer periphery of the dome body.

3. The non-planar CVD polycrystalline diamond body according to claim 2, wherein the dome body and the peripheral body are integrally formed from polycrystalline diamond.

4. The non-planar CVD polycrystalline diamond body according to claim 1, wherein the dome body comprises a partial spherical surface.

5. The non-planar CVD polycrystalline diamond body according to claim 1, wherein the dome body has an average radius of curvature selected from any of 6 mm to 23 mm, 8 mm to 20 mm, and 10 mm to 15 mm.

6. The non-planar CVD polycrystalline diamond body according to claim 1, wherein the dome body has a maximum linear dimension at the outer periphery selected from any of 5 mm to 25 mm, 6 mm to 20 mm, and 8 mm to 15 mm.

7. The non-planar CVD polycrystalline diamond body according to claim 1, wherein a distance between a first plane intersected by the apex and a second parallel plane intersected by the outer periphery is selected from any of 1 to 6 mm, 2 to 5 mm and 2.5 to 4 mm.

8. The non-planar CVD polycrystalline diamond body according to claim 1, wherein the dome body thickness has a coefficient of variation selected from any of no more than 0.08, no more than 0.07 and no more than 0.05.

9. The non-planar CVD polycrystalline diamond body according to claim 1, wherein a mean dome body thickness is selected from any of 10 µm to 100 µm, 20 to 80 µm, 30 to 60 µm and 40 to 50 µm.

10. A speaker dome comprising the non-planar CVD polycrystalline diamond body according to claim 1.

11. The speaker dome according to claim 10, wherein during use a break-up frequency of the speaker dome is selected from any of greater than 10 kHz, 20 kHz, 30 kHz, 40 kHz, 50 kHz, 60 kHz, 65 kHz and 70 kHz.

12. A method of fabricating the non-planar CVD polycrystalline diamond body according to claim 1, the method comprising:

providing a non-planar substrate, the substrate defining a dome body mould, the dome body mould having an average radius of curvature in a range of 4 mm to 25 mm, a maximum linear dimension at an outer periphery of the dome body of no more than 26 mm, wherein the average radius of curvature of no less than 0.6 times the maximum linear dimension at the outer periphery;

in a CVD reactor, growing a film of polycrystalline diamond on the non-planar substrate; to a mean dome body thickness in a range of 10 µm to 100 µm; and removing the film of polycrystalline diamond from the substrate to form the non-planar body.

13. The method according to claim 12, wherein the reactor is selected from any one of a microwave plasma CVD reactor, a hot filament reactor, and a DC arc jet reactor.

14. The method according to claim 12, further comprising providing a plurality of non-planar substrates and growing films of polycrystalline diamond on each of the plurality of non-planar substrates in the CVD reactor.

* * * * *